(12) United States Patent
Bieri et al.

(10) Patent No.: US 10,151,814 B2
(45) Date of Patent: Dec. 11, 2018

(54) APPARATUS AND METHOD FOR IMPROVING BALANCED STEADY-STATE FREE PRECISION IN MAGNETIC RESONANCE IMAGING

(71) Applicants: SIEMENS HEALTHCARE GMBH, Erlangen (DE); UNIVERSITAETSSPITAL BASEL, Basel (CH)

(72) Inventors: Oliver Bieri, Liestal (CH); Tom Hilbert, Lausanne (CH); Tobias Kober, Lausanne (CH); Gunnar Krueger, Watertown-Boston, MA (US); Damien Nguyen, Pully (CH)

(73) Assignees: Siemens Healthcare GmbH, Erlangen (DE); Universitaetsspital Basel, Basel (CH)

( * ) Notice: Subject to any disclaimer, the term of this patent is extended or adjusted under 35 U.S.C. 154(b) by 135 days.

(21) Appl. No.: 15/133,907

(22) Filed: Apr. 20, 2016

(65) Prior Publication Data
US 2016/0334487 A1    Nov. 17, 2016

(30) Foreign Application Priority Data
May 11, 2015 (EP) .................................. 15167175

(51) Int. Cl.
*G01R 33/561* (2006.01)
*G01R 33/50* (2006.01)
*G01R 33/565* (2006.01)

(52) U.S. Cl.
CPC ......... *G01R 33/5614* (2013.01); *G01R 33/50* (2013.01); *G01R 33/56536* (2013.01); *G01R 33/56563* (2013.01)

(58) Field of Classification Search
None
See application file for complete search history.

(56) References Cited

U.S. PATENT DOCUMENTS 5,270,654 A * 12/1993 Feinberg ............ G01R 33/5615
324/307
7,567,081 B2 * 7/2009 Bieri .................... G01R 33/286
324/300

(Continued)

OTHER PUBLICATIONS

Sumpf T.J., et al.: "Model-Based Nonlinear Inverse Reconstruction for T2 Mapping Using Highly Undersampled Spin-Echo MRI", Journal of Magnetic Resonance Imaging, vol. 34, pp. 420-428, 2011.

(Continued)

*Primary Examiner* — Paresh H Patel
(74) *Attorney, Agent, or Firm* — Laurence Greenberg; Werner Stemer; Ralph Locher (57) ABSTRACT

A method for improving image homogeneity of image data acquired from balanced Steady-State Free Precision (bSSFP) sequences in magnetic resonance imaging. Multiple bSSFP sequences are performed with different radio frequency phase increments to create multiple bSSFP image volumes with different phase offsets ϕ. Each image has voxels whose intensity M is a function of a nuclear resonance signal (or magnetization) measured by the MR imaging apparatus. Per-voxel fitting of a mathematical signal model onto the measured magnetization of the field of view in function of the phase offsets Φ. Then the spin density $M_0$, the relaxation time ratio Λ and the local phase offset ΔΦ are determined from the fit for each voxel. A homogeneous image of the object is generated by calculating the signal intensity in each voxel, using the spin density $M_0$ and the relaxation time ratio Λ, wherein ΔΦ is chosen such that Φ−ΔΦ=0°.

5 Claims, 7 Drawing Sheets

(56) References Cited

U.S. PATENT DOCUMENTS 9,835,705 B2 * 12/2017 Weingartner .......... G01R 33/50
2011/0234224 A1 * 9/2011 Bieri .................. G01R 33/5614
324/309

OTHER PUBLICATIONS

Carr H. Y. Steady-State Free Precession in Nuclear Magnetic Resonance; Physical Review, vol. 112, No. 5 Dec. 1958, pp. 1693-1701 (1958).

Freeman R. et al: "Phase and Intensity Anomalies in Fourier Transform NMR"; Journal of Magnetic Resonance; vol. 4, No. 3; pp. 366-383; Feb. 4, 1971; XP023956637; Iss. N: . 0022. -2364 DOI:10.1016/0022-2364(71)90047-3.

Lustig M. et al; "Sparse MRI: The Application of Compressed Sensing for Rapid MR Imaging"; Magnetic Resonance in Medicine; vol. 58; pp. 1182-1195; 2007.

Filbert T. et al.: "TrueCISS: Genuine bSSFP Signal Reconstruction from Undersampled Multiple-Acquisition SSFP Using Model-Based Iterative Non-Linear Inversion"; Proceedings of the International Society for Magnetic Resonance in Medicine, ISMRM 23rd Annual Meeting and Exhibition Toronto, Ontario, Canada, No. 83; p. 83 ; XP040665766; 2015.

Cukur T. "Accelerated Phase-Cycled SSFP Imaging With Compressed Sensing"; IEEE Transactions on Medical Imaging, IEEE, Service Center, Piscataway, NJ, US, vol. 34; No. 1; pp. 107-115; XP011568784; ISSN: 0278-0062, DOI:10.1109/TMI.2014.234681; 2015.

Pruessmann Klaas P., et al.: "SENSE: Sensitivity Encoding for Fast MRI", in: Magnetic Resonance in Medicine, No. 42, pp. 952-962, 1999; 1999.

Casselmann, Jan W. et al.: "Pathology of the Membranous Labyrinth: Comparison of T 1- and T2-Weighted and Gadolinium-Enhanced Spin-Echo and 3DFT-CISS Imaging", In: American Journal of Neuroradiology 14.1, pp. 59-69; 1993.

Deoni, S. CL: "Rapid T2 Estimation With Phase-Cycled Variable Nutation Steady-State Free Precession", Magnetic Resonance in Medicine vol. 52, pp. 435-439; 2004.

Block K.T. et. al.: "Model-Based Iterative Reconstruction for Radial Fast Spin-Echo MRI", Medical Imaging, vol. 28, No. 11, pp. 1759-1769; 2009.

Bieri Oliver: "An Analytical Description of Balanced Steady-State Free Precession with Finite Radio-Frequency Excitation"; Magnetic Resonance in Medicine., vol. 65; 2011; pp. 422-431; XP055227840; ISSN: 0740-3194; DOI: 10.1002/mrm.22626.

Griswold M. A., et.al.: "Generalized Autocalibrating Partially Parallel Acquisitions (GRAPPA)", Magnetic Resonance in Medicine, vol. 47, pp. 1202-1210, 2002.

Björk, Marcus et al.: "Signal Processing Algorithms for Removing Banding Artifacts in MRI"; 18th European Signal Processing Conference (EUSIPC0-2010), Aalborg, Denmark, Aug. 2010 IEEE; pp. 1000-1004; XP032757457; ISSN: 2076-1465; 2011.

Santini F. et al.: "Reconstruction and frequency mapping with phase-cycled bSSFP"; Proceedings of the International Society for Magnetic Resonance in Medicine, ISMRM; 18th Scientific Meeting and Exhibition; Stockholm, Sweden; pp. 3089; XP040614540; 2010.

Björk, Marcus et al: "Parameter Estimation Approach to Banding Artifact Reduction in Balanced Steady-State Free Precession"; Magnetic Resonance in Medicine; vol. 72; No. 3; pp. 880-892; XP055227838; ISSN: 0740-3194, DOI: 10.1002/mrm.24986; 2014.

* cited by examiner

APPARATUS AND METHOD FOR IMPROVING BALANCED STEADY-STATE FREE PRECISION IN MAGNETIC RESONANCE IMAGING

CROSS-REFERENCE TO RELATED APPLICATION

This application claims the priority, under 35 U.S.C. § 119, of European patent application EP 15 167 175.7, filed May 11, 2015; the prior application is herewith incorporated by reference in its entirety.

BACKGROUND OF THE INVENTION

Field of the Invention

The present invention lies in the field of magnetic resonance imaging (MRI) and relates, generally, to balanced steady-state free precision (bSSFP) imaging in magnetic resonance (MR).

Figure 1:
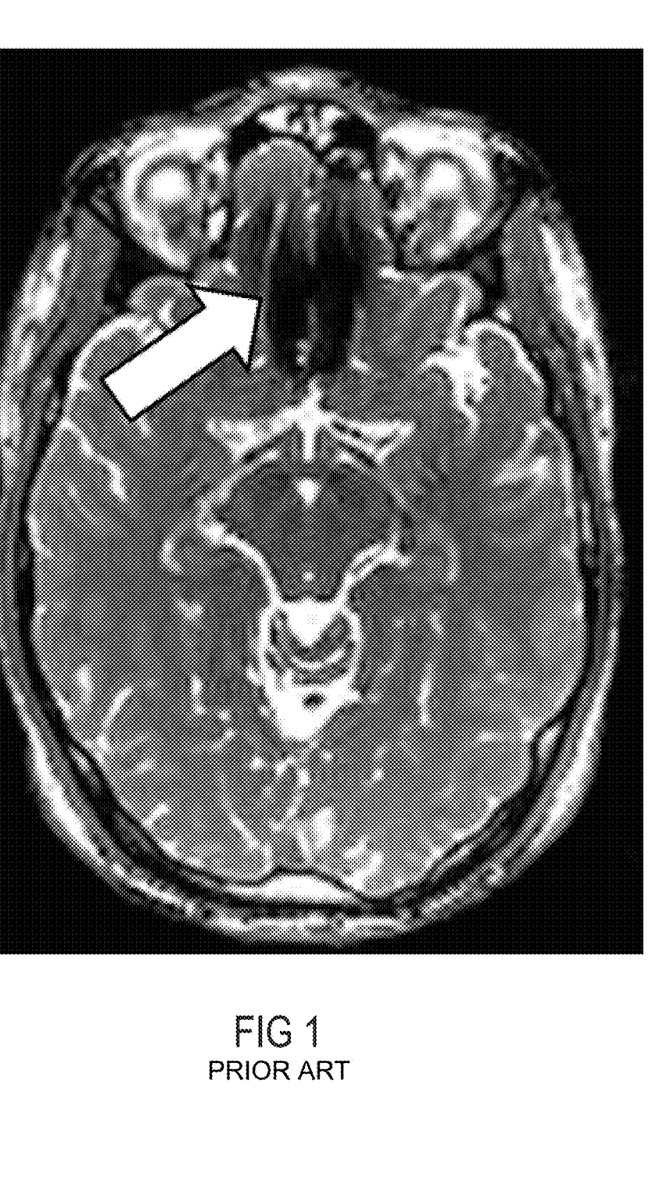
FIG. 1 is an illustration of a signal void at the nasal cavity in a bSSFP image of the human brain caused by local field inhomogeneities (arrow).

Balanced steady-state free precision—bSSFP—is an imaging technique in MR providing a very high signal-to-noise ratio (SNR) in comparison to other MR imaging techniques. However, inevitable field inhomogeneities in the imaged object (off-resonance effects) lead to periodic signal modulations in bSSFP, which typically manifest themselves in the resulting images as regions with reduced or cancelled signal or so-called banding artifacts. FIG. 1 shows an example of a typical case of such a signal void at the nasal cavity in a bSSFP image of the human brain caused by such local field inhomogeneities.

Constructive Interference in Steady State (CISS) addresses this problem of banding artifacts by sequentially acquiring two (or more) bSSFP datasets with different radio-frequency (RF) phase increments. The different RF phase increments add a constant phase to the object to be imaged, effectively moving the location of signal voids spatially. The images can subsequently be combined with different methods, such as sum-of-squares (SOS) or maximum intensity projection (MIP) reconstructions, in order to obtain banding-free images (see e.g. Casselman, Jan W., et al., "*Pathology of the membranous labyrinth: comparison of T1-and T2-weighted and gadolinium-enhanced spin-echo and 3DFT-CISS imaging*", American journal of neuroradiology 14.1 (1993): 59-69).

Figure 2:
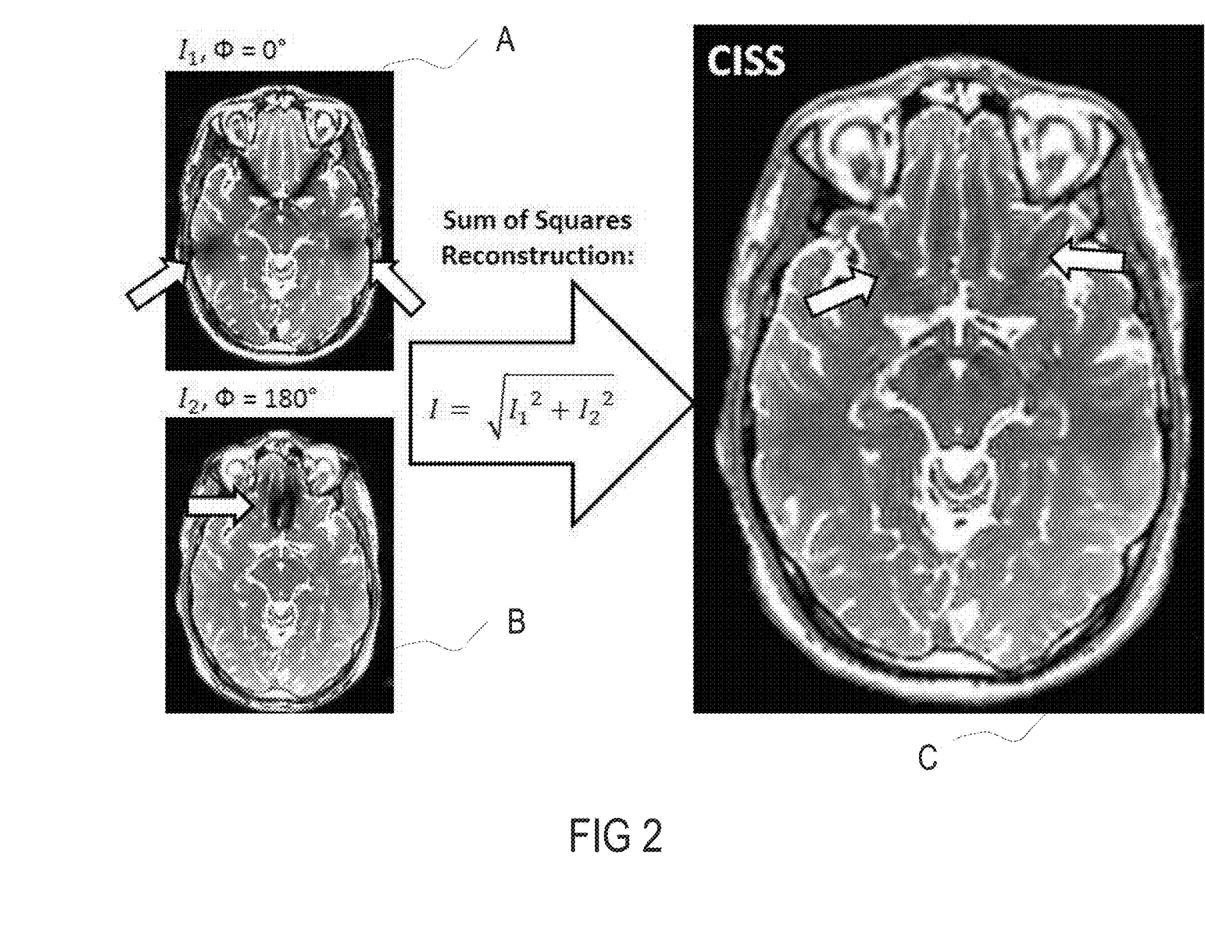
FIG. 2 is an illustration of a CISS image reconstructed using two phase-increments combined calculating the sum of squares of the two images as well as the remaining artefacts in the final CISS image contrast (arrows).

CISS is quite effective to remove banding artifacts in the large flip angle regime (for tissues, typically flip angles greater than about 40-50 degrees are required; for fluids flip angles of around 70-90 degrees are necessary), but fails at low flip angles. Especially at high fields, appropriate CISS imaging might not be feasible due to Specific Absorption Rate (SAR) limitations. Moreover, the reconstructed CISS images do no longer reflect the genuine bSSFP steady-state signal amplitude. For illustration, FIG. 2 shows a CISS image reconstructed using two phase increments and combined by calculating the sum of squares of the two images. It can be seen that residual banding artefacts remain (arrows in FIG. 2) and signal intensities differ from the genuine bSSFP signal (i.e. higher intensities in comparison to FIG. 1).

A banding-free reconstruction of the genuine bSSFP signal is of high interest for the clinical use of bSSFP imaging because signal voids hamper radiological reading. It is also important for quantitative imaging, i.e. T1/T2 relaxometry because a deviation from the true bSSFP signal model introduces false relaxometry estimates.

SUMMARY OF THE INVENTION

It is accordingly an object of the invention to provide a magnetic resonance imaging method and apparatus which overcome the above-mentioned and other disadvantages of the heretofore-known devices and methods of this general type and to provide a method and an apparatus for improving MR images obtained by the bSSFP imaging technique.

With the foregoing and other objects in view there is provided, in accordance with the invention, a method for improving intensity homogeneity of image data acquired using a balanced steady-state free precision (bSSFP) sequence in magnetic resonance (MR) imaging, the method comprising:

performing multiple bSSFP sequences with different radio frequency (RF) phase increments by using a MR imaging apparatus, to generate multiple bSSFP image volumes with different phase offset $\Phi$ of an object to be examined, each image volume containing voxels having intensities M that are a function of a nuclear resonance signal, and wherein a position and a size of the voxel is defined by a field of view (FOV) and a desired resolution;

a per-voxel fitting of a mathematical signal model onto a measured magnetization M of the FOV as a function of the phase offset $\Phi$;

determining from the fit a spin density $M_0$, a relaxation time ratio $\Lambda$ and a local phase offset $\Delta\Phi$ for each voxel;

generating a homogeneous image of the object by calculating a new signal intensity $M(\Phi)$ for each voxel, using the previously obtained spin density $M_0$ and the relaxation time ratio $\Lambda$, and choosing $\Delta\Phi$ so that $\Phi-\Delta\Phi=0°$, in order to obtain the homogeneous image of the object.

In other words, the objects of the invention are achieved with respect to a method for improving intensity homogeneity of image data acquired from a bSSFP sequence in MR imaging by removing the banding effect, the method comprising:

performing multiple bSSFP sequences with different radio frequency (RF) phase increments by using a MR imaging apparatus in order to create multiple bSSFP image volumes (i.e. a bSSFP image series) with different phase offsets $\phi$ of an object to be examined, wherein each image volume comprises voxels whose intensities M are a function of a nuclear resonance signal (or magnetization) measured by the MR imaging apparatus. Each image voxel corresponds to a sub-volume of the whole measurement volume, wherein its position and size is defined by a Field of View (FOV) and the image resolution. According to known techniques, the MRI apparatus will acquire the so-called nuclear resonance signal for each sub-volume thus for each image voxel. Hereafter, a voxel will be referred to as both, a sub-volume of the whole measured volume, defined by FOV and resolution, and a data-point in the image as they represent the same volume of the object to be imaged.

a per-voxel fitting of a mathematical signal model onto the measured magnetization (represented by the image intensity M) of the FOV in function of the phase offset $\Phi$ (i.e. the different bSSFP images with different RF increment) for instance by using the equation:

$$M(\Phi) = \qquad\qquad\text{(Eq. 1)}$$

-continued $$M_0 \frac{2\sin\alpha \left|\cos\left(\frac{\Phi - \Delta\Phi}{2}\right)\right|}{1 + \cos\alpha + 2\cos(\Phi - \Delta\Phi) + \left(4\Lambda - 2\cos(\Phi - \Delta\Phi)\sin\left(\frac{\alpha}{2}\right)^2\right)}$$

wherein $M_0$ is the spin density of a given voxel in the FOV, $\Lambda$ the relaxation time ratio T1/T2, $\alpha$ the flip-angle of the bSSFP sequence, $\Delta\Phi$ the local phase offset caused by B0 field inhomogeneity for said given voxel;

determining from said fit the spin density $M_0$, the relaxation time ratio $\Lambda$ and the local phase offset $\Delta\Phi$ for each voxel. Optionally, at least one of the following quantitative parameter maps might be determined: a quantitative parameter map representing the spin density $M_0$ for all voxels; a quantitative parameter map representing the relaxation time ratio $\Lambda$ for all voxels; and a quantitative parameter map representing the local phase offset $\Delta\Phi$ for all voxels;

generating a homogeneous image of said object, called hereafter "trueCISS image contrast", by calculating a new signal intensity $M(\Phi)$ for each voxel using the previously obtained spin density $M_0$ and the relaxation time ratio $\Lambda$ into Eq. 1, wherein $\Delta\Phi$ is chosen such that $\Phi - \Delta\Phi = 0°$ in order to obtain an on-resonant bSSFP image, the latter being advantageously characterized by no signal voids and genuine bSSFP signal contrast, and thus the homogeneous image of said object. The flip-angle $\alpha$ is an independent variable within the mathematical signal model (Eq. 1), and can therefore be freely chosen, advantageously providing true-CISS images of any desired flip-angle even though the bSSPF image data was acquired using a different flip-angle.

The FOV of an object to be examined is for example a slice of a human brain that has to be examined by means of the MR imaging apparatus. According to known techniques, the MR imaging apparatus is indeed able to select an FOV in said object by using gradient magnetic fields in all three spatial directions that are produced by gradient coils of said MR imaging apparatus and to excite nuclear spins of the object(s) that are within said FOV. According to the present invention, a bSSFP sequence is in particular used. The MR imaging apparatus is then able to measure a nuclear resonance signal for the whole measurement volume defined by the FOV, said nuclear resonance signal resulting from the excitation of the nuclear spins within the FOV. The MR imaging apparatus is then able to convert said nuclear resonance signal into image data of the object (also referred as "image reconstruction"), wherein the image comprises voxels of different intensities. According to the present invention, the obtained images are called "bSSFP images", to point out that a bSSFP sequence was used for acquisition. Each voxel intensity represents thus (or is a function of) the intensity of the measured nuclear resonance signal for a sub-volume, defined by the configured FOV and resolution. The previously described technique is known in the art and does not require further explanations.

Preferably, the claimed method comprises the acquisition of a minimum of two, preferably eight, bSSFP images with different radio frequency (RF) phase increments in order to perform a robust fit by means of Eq. 1. Optionally, the present method comprises a subsampling of the acquisition of the multiple bSSFP images with different radio frequency (RF) phase increments in order to achieve the same or shorter acquisition time as required for CISS (e.g. subsampling factor 4 when using 8 phase increments). Advantageously, subsampling of the acquisition allows decreasing the acquisition time required for acquiring entire images of the object to be examined. For this purpose and preferably, advanced reconstruction methods such as Model-Based Reconstruction method (see e.g. Block K. T. et al., "Model-based iterative reconstruct on for radial fast spin-echo MRI", Medical Imaging, IEEE Transactions on medical imaging, 28, NO 11(2009): 1759-1769; or Sumpf T. J. et al., "Model-based non-linear inverse reconstruction for T2 mapping using highly undersampled spin-echo MRI", Journal of Magnetic Resonance Imaging 34.2 (2011): 420-428); or Compressed Sensing method (see e.g. Lustig M. et al., "Sparse MRI: The application of compressed sensing for rapid MR imaging", Magnetic resonance in medicine 58.6 (2007): 1182-1195); or Parallel Imaging method (see e.g. Pruessmann K. P. et al, "SENSE: sensitivity encoding for fast MRI.," Magnetic resonance in medicine 42.5 (1999): 952-962; or Griswold M. A. et al., "Generalized autocalibrating partially parallel acquisitions (GRAPPA)", Magnetic Resonance in Medicine 47.6 (2002): 1202-1210);

are used according to the present invention to yield quantitative parameter-maps (i.e. the spin density $M_0$, the relaxation time ratio $\Lambda$ and the local phase offset $\Delta\Phi$) and trueCISS image contrast without aliasing artifacts.

Finally, the present invention also concerns a MRI apparatus for imaging an object, said MRI apparatus being configured for performing the method steps previously described.

Preferably, each step of the method is automatically performed, for example, by the MR imaging apparatus, without human intervention.

Once more in summary, the present invention provides for a method for improving image homogeneity of image data acquired from balanced Steady-State Free Precision (hereafter bSSFP) sequences in Magnetic Resonance (hereafter MR) imaging. The novel method comprises:

performing multiple bSSFP sequences with different radio frequency (hereafter RF) phase increments by using a MR imaging apparatus in order to create multiple bSSFP image volumes with different phase offset $\phi$ of an object to be examined, wherein each image comprises voxels whose intensity M is a function of a nuclear resonance signal (or magnetization) measured by the MR imaging apparatus;

per-voxel fitting of a mathematical signal model onto the measured magnetization (i.e. image intensity M) of the Field of View (hereafter FOV) in function of the phase offsets $\Phi$ (i.e. the different bSSFP images with different RF increment);

determining from said fit the spin density $M_0$, the relaxation time ratio $\Lambda$ and the local phase offset $\Delta\Phi$ for each voxel;

generating a homogeneous image of said object by calculating the signal intensity in each voxel, using the previously obtained spin density $M_0$ and the relaxation time ratio $\Lambda$ in Eq. 1, wherein $\Delta\Phi$ is chosen such that $\Phi - \Delta\Phi = 0°$, in order to obtain the homogeneous image.

Other features which are considered as characteristic for the invention are set forth in the appended claims.

Although the invention is illustrated and described herein as embodied in an apparatus and method for improving bSSFP in magnetic resonance imaging, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

FIG. 1 is an illustration of a transverse slice of the brain acquired with a bSSFP sequence according to prior art bSSFP techniques. A typical signal void occurred at the nasal cavity due to off-resonances (see arrow).

FIG. 2 shows a CISS image C reconstructed using two phase increments ($\Phi=0$ and $\Phi=180°$) combined by calculating the sum of squares of the two images intensities I1, I2 for each voxel of the images A and B. While the CISS image C shows fewer signal voids than the pure bSSFP image, residual banding artefacts are visible (arrows) and signal intensities differ from a genuine bSSFP signal.

Figure 3:
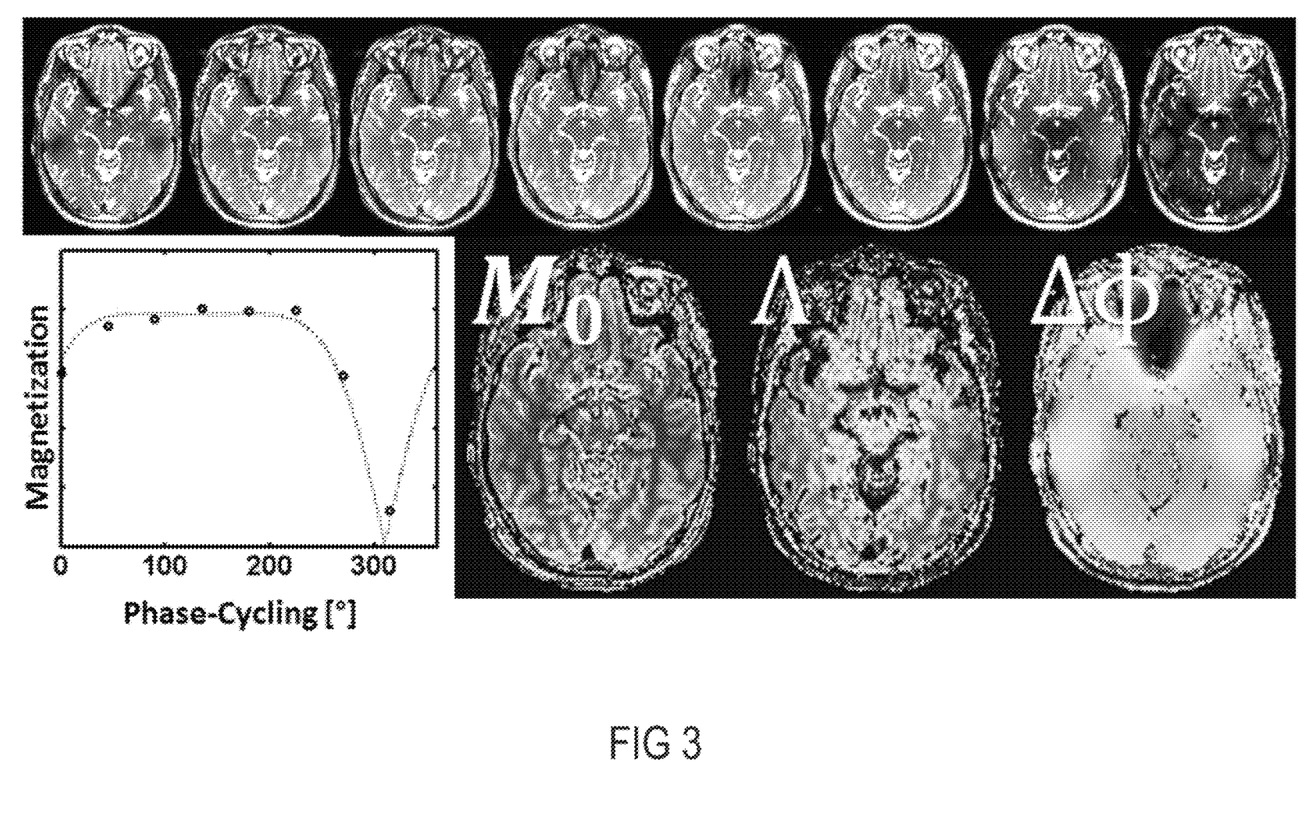
FIG. 3 is an illustration of the method according to the invention.
Figure 4:
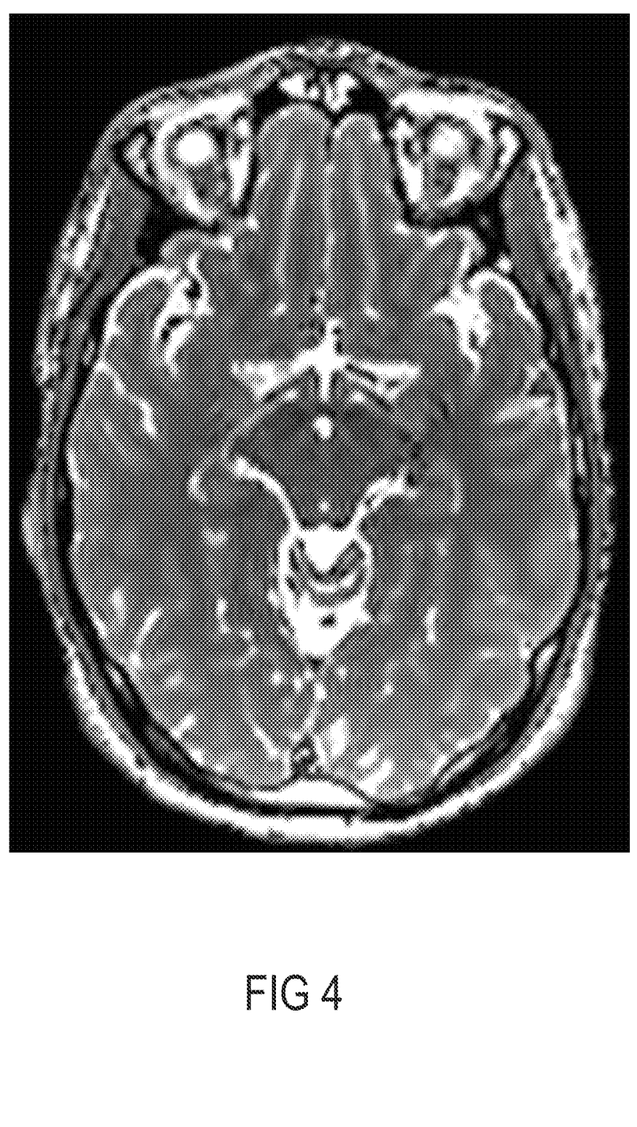
FIG. 4 is an example of a trueCISS image contrast obtained according to the present invention.

FIG. 3 exemplarily shows at the top eight acquisitions of a brain slice image with different phase increments (also referred to as phase-cycled bSSFP acquisition), at the bottom left, signal intensities of one voxel along the phase increments (dots) and the fitted mathematical signal model (dotted line) according to Eq. 1, and at the bottom right, the three resulting parameter maps $M_0$, $\Lambda$ and $\Delta\Phi$ obtained after fitting the mathematical signal model onto the acquired bSSFP image data. The resulting parameter maps are then used to synthesize an on-resonant bSSFP image by applying the mathematical signal model (Eq. 1) with $\phi-\Delta\phi=0°$, resulting in an image with no signal voids and genuine bSSFP signal contrast. A resulting image contrast is shown in FIG. 4, where it can be seen that no residual phase bands are present. The contrast depends purely on the genuine bSSFP signal. Furthermore and advantageously, the parameter maps may be directly used for the quantification of tissue properties such as the transverse relaxation T2 or proton density.

Figure 5:
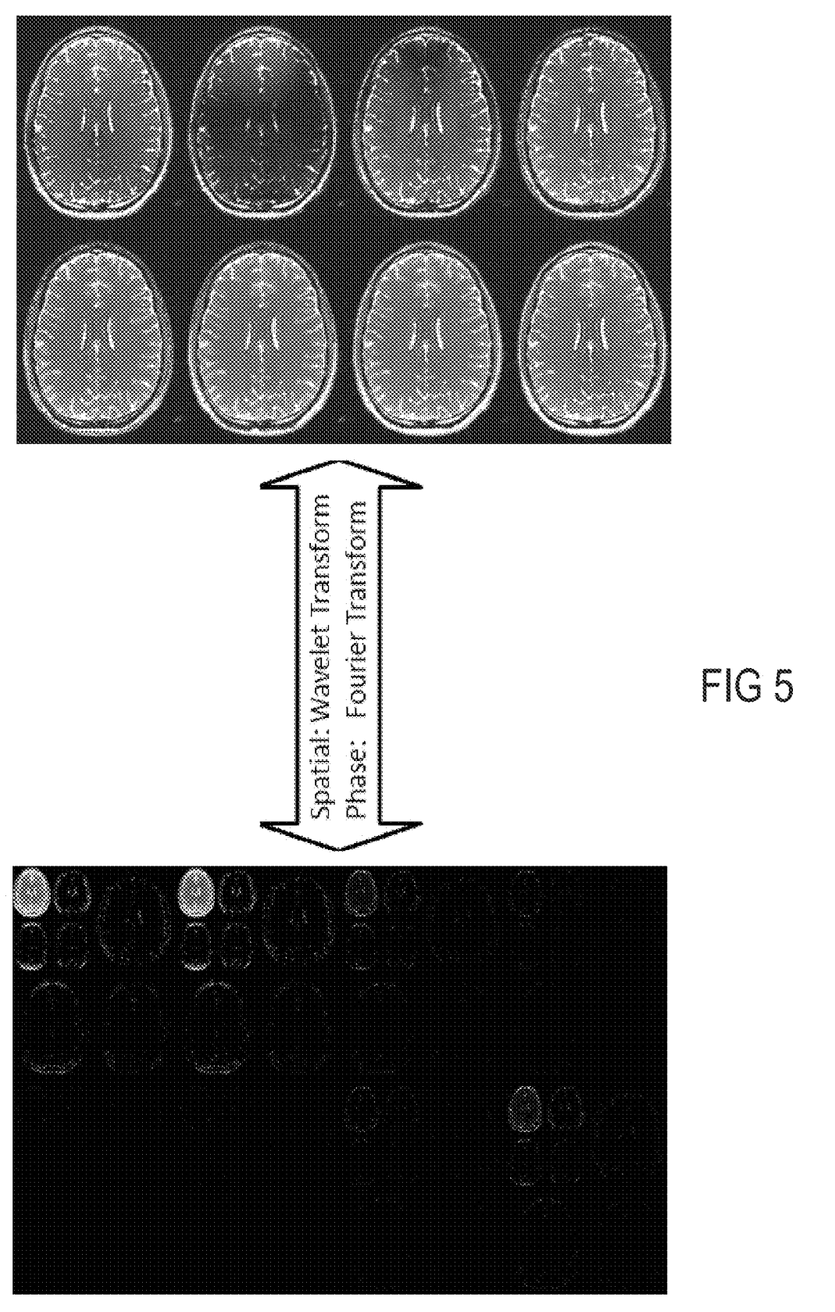
FIG. 5 is an illustration of a transformation of eight bSSFP images with different phase increments into a sparse representation by applying a wavelet transform in the spatial domain and a Fourier transform along the phase increment dimension, providing a good fundament for a compressed sensing reconstruction.
Figure 6:
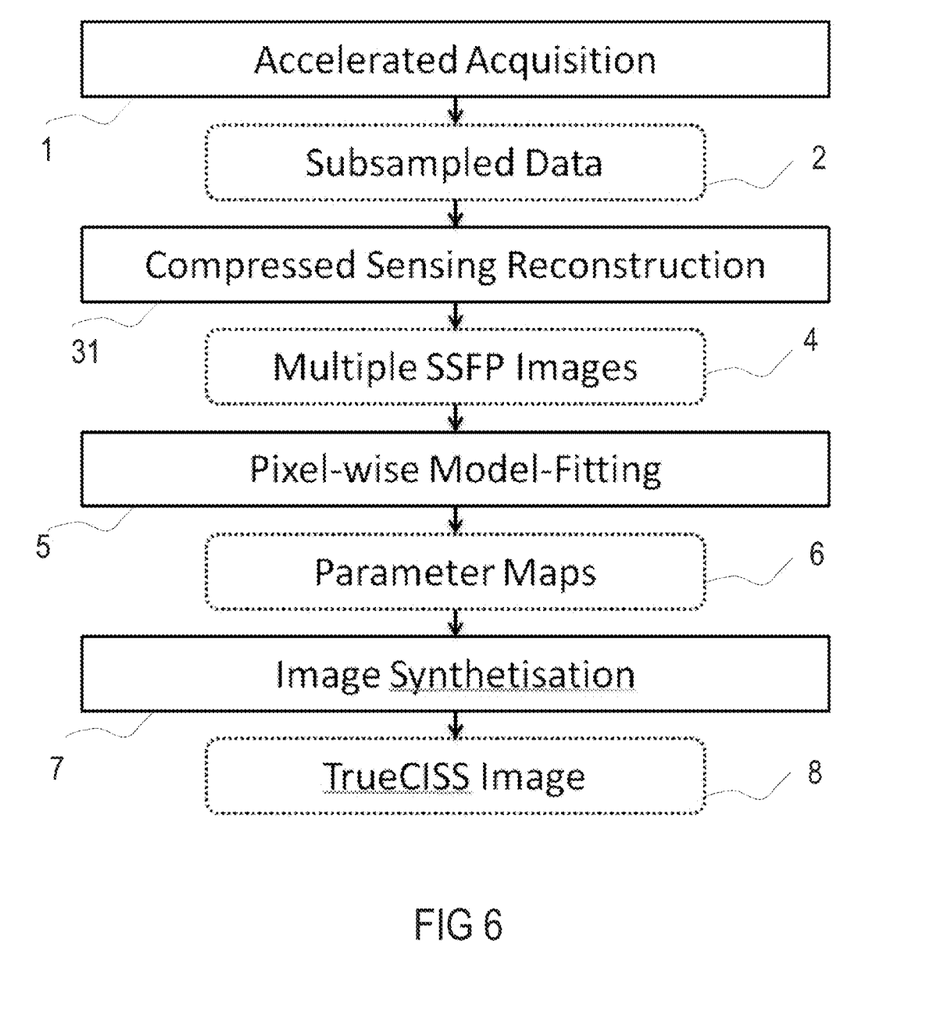
FIG. 6 is a flowchart of a trueCISS image reconstruction using compressed sensing according to the invention.
Figure 7:
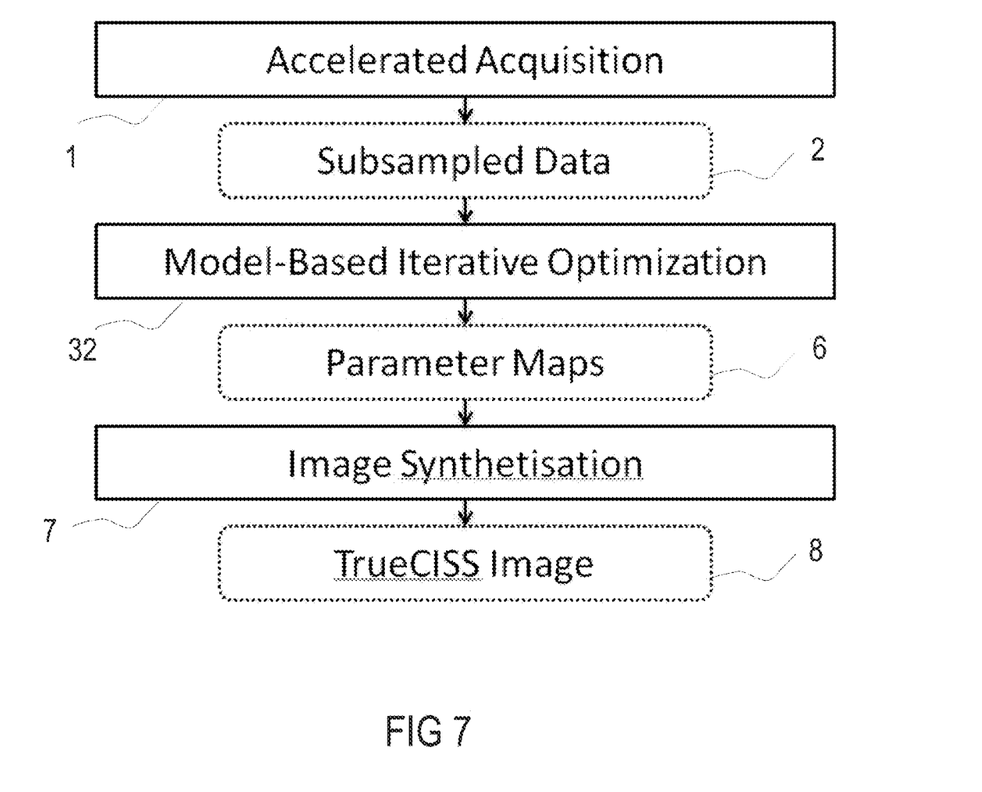
FIG. 7 is a flowchart of the trueCISS image reconstruction using model-based iterative optimization according to the invention.

FIGS. 5 to 7 illustrate the present invention in the particular case of using advanced image reconstruction methods for subsampling the acquisition of the multiple bSSFP images with different RF phase increments in order to achieve a shorter acquisition time. TrueCISS images based on a undersampled acquisition can be reconstructed using for example Compressed Sensing (see FIG. 5 for an example of rendering the undersampled images sparse as well as FIG. 6 showing an applicable algorithm for a CS reconstruction) or model-based reconstruction (see FIG. 7).

FIG. 6 presents a preferred embodiment of the method according to the invention that starts with an accelerated acquisition 1 of data for a FOV defined for an object to be examined, using a standard bSSFP sequence which, however, acquires only a subset of the usually required data by skipping data samples, that results in an undersampled dataset 2. Then, according to the preferred embodiment illustrated by FIG. 6, the method according to the invention comprises a compressed sensing reconstruction 31. Compressed sensing relies on a sparse representation of the image of the object in order to recover the missing data samples, which were skipped during acquisition, using an iterative optimization. In order to transform the acquired image data into a sparse representation, the present invention proposes to use preferentially a wavelet transformation in the spatial domain and a Fourier transformation along the phase increment dimension. The wavelet transformation is particularly convenient since its transformed domain is sparse for typical medical images. Applying a spatial wavelet transformation together with a Fourier transformation along the phase increment dimension (see FIG. 5 for an example—black pixels mean zero or near-zero values, i.e. the more black, the sparser) provides the advantage that the result is a very sparse representation of the acquired image data due to the harmonic nature of the bSSFP signal-model. According to the invention, the method comprises using a conventional iterative compressed sensing optimization technique to yield or create multiple bSSFP images 4 without aliasing artifacts using the previously proposed sparse representation of the image data (see, e.g., Lustig et al., supra, for more details on compressed sensing). Subsequently, the method comprises a voxel-wise model-fitting 5, i.e. fitting the mathematical signal model of Eq. 1 for each sub-volume onto the corresponding voxel intensities of the multiple bSSFP images which are a function of the RF phase offset, determining the three resulting parameter maps 6. Finally, the method according to FIG. 6 comprises the generation 7 of an on-resonant bSSFP image in order to obtain the trueCISS image 8.

FIG. 7 presents another preferential embodiment of the method according to the invention that starts also (as for FIG. 6) with an accelerated acquisition 1 of data for a FOV, defined for an object to be examined, resulting in an undersampled dataset 2. According to said other embodiment, the method according to the invention proposes to use a model-based iterative optimization 32 to reconstruct the trueCISS image 8. In this case, the mathematical signal model given by Eq. 1 is used as prior knowledge to recover missing samples of the undersampled data, using an iterative optimization, intrinsically estimating the required parameter-maps 6 (see Sumpf et al. previously cited for more details). The parameter maps 6 are then used to synthesize 7 the trueCISS image 8 as previously described.

To summarize, the present invention proposes the following:
  to use the mathematical signal model given by Eq. 1 for
    fitting a series of bSSFP images with different phase offsets in order to obtain quantitative parameter maps, wherein the fitting provides the advantage of automatically separating image information that depends on the environment (i.e. local field offset $\Delta\phi$) from tissue parameters of interest (i.e. $M_0, \Lambda$). Advantageously, the parameter maps may be directly used for a quantification of tissue properties such as relaxometry or proton density; and to synthesize a phase band free image, i.e. said trueCISS image, with intensities according to the genuine bSSFP signal by applying the mathematical signal model Eq. 1 onto the parameter-maps and assuming that no local field inhomogeneity is present ($\phi-\Delta\phi=0°$), wherein the synthesized image is advantageously free of signal voids. Additionally, the image intensities represent the genuine bSSFP signal in contrary to the conventional CISS method; and optionally an undersampling of the multiple bSSFP image acquisition in order to accelerate the measurement, notably by using image reconstruction techniques such as compressed sensing, parallel imaging or model-based iterative optimization.

The invention claimed is:

1. A method for improving intensity homogeneity of image data acquired using a balanced steady-state free precision (bSSFP) sequence in magnetic resonance (MR) imaging, the method comprising:

performing multiple bSSFP sequences with different radio frequency (RF) phase increments by using a MR imaging apparatus, to generate multiple bSSFP image volumes with different phase offset $\Phi$ of an object to be examined, each image volume containing voxels having intensities M that are a function of a nuclear resonance signal, and wherein a position and a size of the voxel is defined by a field of view (FOV) and a desired resolution;

a per-voxel fitting of a mathematical signal model onto a measured magnetization M of the FOV as a function of the phase offset $\Phi$;

determining from the fit a spin density $M_0$, a relaxation time ratio $\Lambda$ and a local phase offset $\Delta\Phi$ for each voxel;

generating a homogeneous image of the object by calculating a new signal intensity $M(\Phi)$ for each voxel, using the previously obtained spin density $M_0$ and the relaxation time ratio $\Lambda$, and choosing $\Delta\Phi$ so that $\Phi-\Delta\Phi=0°$, in order to obtain the homogeneous image of the object; and using the following mathematical signal model for fitting the measured magnetization M of the FOV as a function of the phase offset $\Phi$:

$$M(\Phi) = M_0 \frac{2\sin\alpha \left|\cos\left(\frac{\Phi-\Delta\Phi}{2}\right)\right|}{1+\cos\alpha+2\cos(\Phi-\Delta\Phi)+\left(4\Lambda-2\cos(\Phi-\Delta\Phi)\sin\left(\frac{\alpha}{2}\right)^2\right)}$$

wherein:
$M_0$ is the spin density of a voxel in the FOV;
$\Lambda$ is the relaxation time ratio T1/T2;
$\alpha$ is the applied flip-angle of the bSSFP MR sequence; and
$\Delta\Phi$ is the local phase offset caused by field inhomogeneity for the voxel.

2. The method according to claim 1, which comprises undersampling an acquisition of the multiple bSSFP images with different RF phase increments in order to reduce an acquisition time.

3. The method according to claim 2, which comprises reconstructing the undersampled data by using one or a combination of advanced reconstruction methods selected from the group consisting of:
a model-based reconstruction method;
a compressed sensing method; and
a parallel imaging method.

4. The method according to claim 1, wherein each step is automatically performed.

5. The method according to claim 1, which comprises determining at least one of the quantitative parameter maps selected from the group consisting of:
a quantitative parameter map representing the spin density $M_0$ for all voxels;
a quantitative parameter map representing the relaxation time ratio $\Lambda$ for all voxels; and
a quantitative parameter map representing the local phase offset $\Delta\Phi$ for all voxels.

* * * * *